US008927949B2

(12) United States Patent
Ogawa (10) Patent No.: US 8,927,949 B2
(45) Date of Patent: Jan. 6, 2015

(54) MEASURING APPARATUS, DRAWING APPARATUS, AND ARTICLE MANUFACTURING METHOD

(75) Inventor: Shigeki Ogawa, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 368 days.

(21) Appl. No.: 13/547,390

(22) Filed: Jul. 12, 2012

(65) Prior Publication Data

US 2013/0017476 A1  Jan. 17, 2013

(30) Foreign Application Priority Data

Jul. 13, 2011 (JP) ................................. 2011-154766

(51) Int. Cl.
 *G21K 5/02* (2006.01)
 *G03F 7/20* (2006.01)
 *H01J 37/244* (2006.01)
(52) U.S. Cl.
 CPC ..... *H01J 37/244* (2013.01); *H01J 2237/24514* (2013.01); *H01J 2237/24521* (2013.01)
 USPC .......................... 250/492.3; 250/310; 282/154
(58) Field of Classification Search
 CPC ..................... H01J 37/244; H01J 2237/24514; H01J 2237/24521
 USPC ............... 356/609–625; 250/310, 306, 492.3, 250/396; 382/154, 173, 266
 See application file for complete search history.

(56) References Cited

U.S. PATENT DOCUMENTS

| 4,827,436 | A | * | 5/1989 | Sabersky et al. | ......... 250/559.36 |
| 5,120,976 | A | * | 6/1992 | Clayton et al. | ........... 250/559.07 |
| 5,734,743 | A | * | 3/1998 | Matsugu et al. | .............. 382/154 |
| 6,140,654 | A | | 10/2000 | Nakasugi et al. | |
| 6,370,330 | B2 | * | 4/2002 | Sekine et al. | .................... 396/54 |
| 6,766,055 | B2 | * | 7/2004 | Matsugu et al. | .............. 382/173 |
| 6,995,849 | B2 | * | 2/2006 | Uno et al. | ..................... 356/609 |
| 7,095,022 | B2 | * | 8/2006 | Nakasuji et al. | .............. 250/310 |
| 2009/0226111 | A1 | * | 9/2009 | Ida et al. | ........................ 382/266 |
| 2010/0061638 | A1 | * | 3/2010 | Tanaka | ........................... 382/199 |

FOREIGN PATENT DOCUMENTS

JP 10-64799 A 3/1998
JP 10-106931 A 4/1998

* cited by examiner

*Primary Examiner* — Sang Nguyen
(74) *Attorney, Agent, or Firm* — Rossi, Kimms & McDowell LLP (57) ABSTRACT

The beam measuring apparatus of the present invention includes a detection device including a shield member that has an edge, and a detector configured to detect the beam of which at least a part is not shielded by the shield member; a relative movement mechanism configured to cause a relative movement between the shield member and the beam; and a controller configured to control the detection device and the relative movement mechanism so as to cause one of the edge and the beam to traverse the other with respect to each of a plurality of points on the edge, to sum a plurality of signals, respectively obtained by the detection device with respect to the plurality of points and with respect to relative positions of the relative movement corresponding to one another, so as to obtain a signal sequence, and to obtain the characteristic based on the signal sequence.

10 Claims, 4 Drawing Sheets

FIG. 6

MEASURING APPARATUS, DRAWING APPARATUS, AND ARTICLE MANUFACTURING METHOD

BACKGROUND OF THE INVENTION

1. Field of the Invention

The present invention relates to a measuring apparatus, a drawing apparatus including the same, and an article manufacturing method using the drawing apparatus.

2. Description of the Related Art

In recent years, as micronization of the element, increasingly complex circuit patterns, or a higher capacity of pattern data advance, the drawing accuracy of drawing apparatuses for use in the manufacturing of devices such as semiconductor integrated circuits need to be improved. As a method for realizing such requirements, a drawing apparatus that draws a pattern on a substrate by controlling the deflection scanning and blanking of a charged particle beam such as an electron beam or the like is known. Furthermore, as another method, a drawing apparatus that draws a pattern on a substrate by controlling the diffraction of a light beam as appropriate using an acoustic optical element is also known. In such a conventional drawing apparatus, the circuit pattern formed on one chip is typically divided into a plurality of regions and drawing is performed for each divided region. However, if there is positional error (drift or the like) of a beam, problems may occur at a boundary between the divided regions. When drawing is performed by superimposing the drawing pattern onto a pattern already formed on a substrate, deterioration of overlay accuracy may occur. Thus, in such a drawing apparatus, it is not preferable that a beam is misaligned with respect to a predetermined position. Accordingly, in order to counter beam positional error, a detection device for measuring the position of the beam on a stage is provided in the conventional drawing apparatus so as to measure beam positional error in advance for correction.

Here, micronization of circuit patterns has been advancing with a line width of 25 nm or less. In association with this, the size of the beam diameter also needs to be reduced. Thus, for example, a beam of Gaussian distribution having a half-width equivalent to a width of a requested line may be employed. In contrast, the position of the beam must be measured with the accuracy of 10% or less of a line width. More specifically, if a line width is in the range of from 25 to 50 nm, the position of the beam must be measured with the accuracy of 2 to 5 nm or less. Accordingly, Japanese Patent Laid-Open No. 10-106931 discloses the fact that a plurality of electron beams is incident in the longitudinal direction of the edge of a detection device so as to obtain a signal having a sufficient SN ratio from a sensor. Additionally, since an error in the position of the edge of the detection device becomes a measurement error in the position of a charged beam, Japanese Patent Laid-Open No. 10-64799 discloses the fact that the result of measurement of the position of the beam is corrected by measuring the position error.

However, in order to ensure position measurement with the accuracy of a few nm level, the roughness of the edge of the detection device need to be taken into consideration in addition to the deformation of the detection device due to heat and force, and electrical drift. For example, when the shape, position, or intensity of the beam is measured using a knife-edge method, the influence of the roughness of the edge can be ignored if the half-width of the beam decreases to the level of 11 to 22 nm. In other words, in the devices disclosed in Japanese Patent Laid-Open No. 10-106931 and Japanese Patent Laid-Open No. 10-64799, the roughness of the edge is sufficiently small with respect to the shape or size of the beam to be measured, and thus, the influence of the roughness thereof can be ignored. In contrast, in a recent drawing apparatus that draws a pattern with a line width of 50 nm or less, 2 nm roughness (unevenness) of the edge causes a measurement error of 2 nm at maximum in the position of a beam, and thus, the influence of the roughness thereof cannot be ignored. For example, when the change over time in the position of the beam is measured for correction, a measurement error may consequently affect on drawing accuracy and overlay accuracy.

SUMMARY OF THE INVENTION

Accordingly, the present invention provides, for example, a measuring apparatus that is advantageous in accurate measuring of a beam.

According to an aspect of the present invention, a measuring apparatus that measures characteristics of a beam is provided, which includes a detection device including a shield member that has an edge, and a detector configured to detect the beam of which at least a part is not shielded by the shield member; a relative movement mechanism configured to cause a relative movement between the shield member and the beam; and a controller configured to control the detection device and the relative movement mechanism so as to cause one of the edge and the beam to traverse the other with respect to each of a plurality of points on the edge, to sum a plurality of signals, respectively obtained by the detection device with respect to the plurality of points and with respect to relative positions of the relative movement corresponding to one another, so as to obtain a signal sequence, and to obtain the characteristic based on the signal sequence.

a detection device including a shield member having an edge and a detector for detecting the beam not shielded by the shield member; a relative movement mechanism configured to cause a relative movement between the shield member and the beam; and a controller, wherein the controller is configured to control the detection device and the relative movement mechanism so as to cause either the edge or the beam to traverse the other with respect to a plurality of points on the edge, obtain a signal sequence by summing a plurality of signals corresponding to a relative position of the relative movement obtained by the detection device with respect to the plurality of points, and determine the characteristics of the beam from the signal sequence.

Further features of the present invention will become apparent from the following description of exemplary embodiments with reference to the attached drawings.

DESCRIPTION OF THE EMBODIMENTS

Hereinafter, preferred embodiments of the present invention will be described with reference to the drawings.

Firstly, a description will be given of a drawing apparatus having a beam measuring apparatus according to one embodiment of the present invention. Hereinafter, the drawing apparatus to be described in the present embodiment is a multiple-beam type charged particle beam drawing apparatus that deflects a plurality of electron beams (charged particle beams) and independently control the blanking (OFF of irradiation) of electron beams to thereby draw predetermined drawing data on the predetermined position of a substrate to be treated. Here, a charged particle beam of the present embodiment is not limited to an electron beam, but may be other charged particle beams such as an ion beam. The drawing apparatus of the present invention is not limited to a charged particle beam drawing apparatus but may also be a light beam drawing apparatus that draws a pattern on a substrate by controlling the diffraction of a light beam (laser beam) as appropriate using an acoustic optical element.

Figure 1:
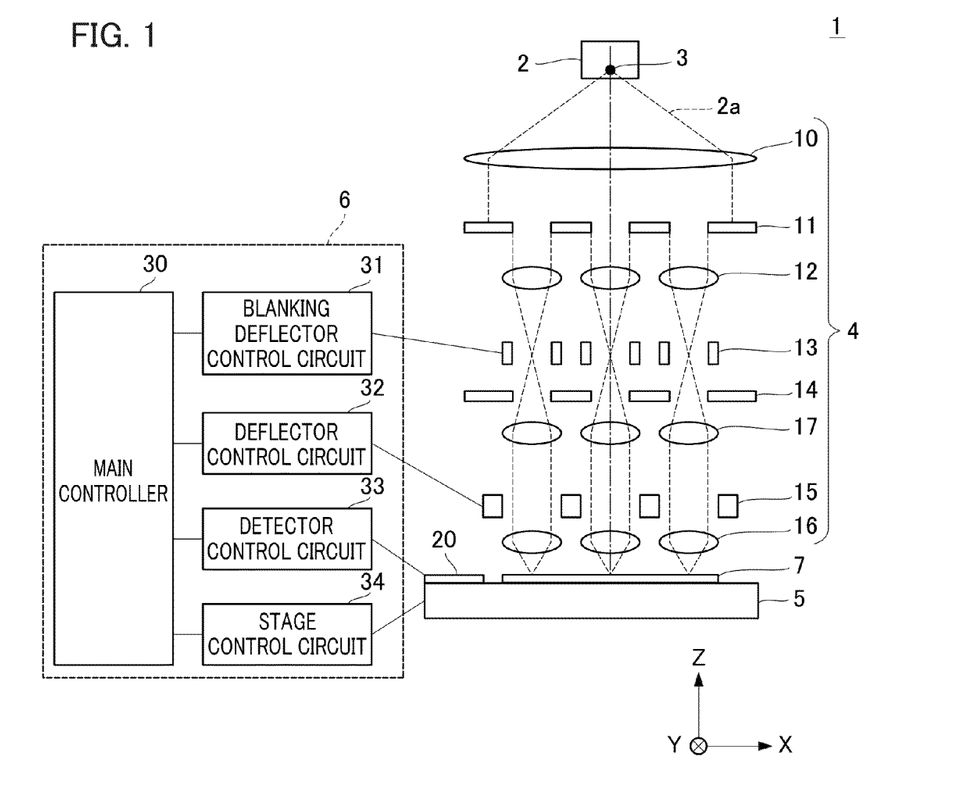
FIG. 1 is a diagram illustrating the configuration of a drawing apparatus according to one embodiment of the present invention.

FIG. 1 is a diagram illustrating the configuration of a drawing apparatus 1 of the present embodiment. Also, in the following drawings, a description will be given in which the Z axis is in an irradiation direction of an electron beam to a substrate to be treated, and the X axis and the Y axis are mutually oriented in directions orthogonal to a plane perpendicular to the Z axis. Furthermore, in the following drawings, the same elements as those in the drawing apparatus 1 shown in FIG. 1 are designated by the same reference numerals. The drawing apparatus 1 includes an electron gun 2, an optical system 4 configured to split an electron beam emitted from a crossover 3 of the electron gun 2 into a plurality of electron beams, deflect and focus the plurality of electron beams, a substrate stage 5 configured to hold a substrate to be treated, and a controller 6 configured to control the operation of the components of the drawing apparatus 1. Note that an electron beam is readily attenuated under an atmosphere at normal pressure and is also discharged under high voltage. In order to prevent such phenomena, the components excluding the controller 6 are installed in a space in which the internal pressure is appropriately adjusted by a vacuum exhaust system (not shown). For example, the electron gun 2 and the optical system 4 are installed within an electron optical barrel which is held at a high vacuum. Likewise, the substrate stage 5 is installed in a chamber in which the degree of vacuum is relatively lower than that in the electron optical barrel. Also, a substrate 7 to be treated is a wafer consisting of, for example, single crystal silicon. A photosensitive resist is coated on the surface of the substrate 7 to be treated.

The electron gun 2 is mechanism that emits electron beams by applying heat or electric field. In FIG. 1, tracks 2a of electron beams emitted from the crossover 3 are shown by dotted lines. The optical system 4 includes a collimator lens 10, an aperture array 11, a first electrostatic lens array 12, a blanking deflector array 13, a blanking aperture array 14, a deflector array 15, and a second electrostatic lens array 16 in the recited order from the electron gun 2. The optical system 4 may also include a third electrostatic lens array 17 at the downstream side of the blanking aperture array 14. The collimator lens 10 is an optical element that is constituted by an electromagnetic lens and collimates electron beams emitted from the crossover 3 into collimated beams. The aperture array 11 is a mechanism that has a plurality of circular openings arranged in a matrix form and splits an electron beam incident from the collimator lens 10 into a plurality of electron beams. The first electrostatic lens array 12 is an optical element that is constituted by three electrode plates (in FIG. 1, three electrode plates are shown integrally as an integral plate) each having a circular opening and focuses electron beams to the blanking aperture array 14. Both of the blanking deflector array 13 and the blanking aperture array 14 are mechanisms that are arranged in a matrix form and perform the ON (non-blanking state)/OFF (blanking state) of irradiation of each electron beam. The deflector array (deflector) 15 is a mechanism that is capable of deflecting an image on the surface of the substrate 7 to be treated, which is placed on the substrate stage 5, in the X direction. Furthermore, the second electrostatic lens array 16 is an optical element that focuses electron beams, which have passed through the blanking aperture array 14, onto the substrate 7 to be treated or focuses the image of the original crossover 3 onto an electron beam detection device 20 (to be described below) provided on the substrate stage 5.

The substrate stage 5 is a substrate holding unit configured to be appropriately movable at least in the XY two-axial directions while holding the substrate 7 to be treated using, for example, electrostatic attraction. The position of the substrate stage 5 is measured by an interferometer (laser length measuring apparatus) (not shown) in real-time. For example, the resolution at this time is about 0.1 nm. Also, the substrate stage 5 includes an electron beam detection device (hereinafter referred to as "detection device") 20, which is provided on the electron beam irradiation plane, for detecting electron beams. The output signal (electrical signal) of the detection device 20 is used for calculation of the electron beam intensity distribution with respect to a change in electron beams. The details of which will be described below. Here, the term "intensity distribution" of the present embodiment indicates an index used when determining characteristics such as the shape, position, and intensity of an electron beam. For detecting the intensity distribution, for example, a knife-edge method using the edge of a detection mark may be employed.

Figure 2:
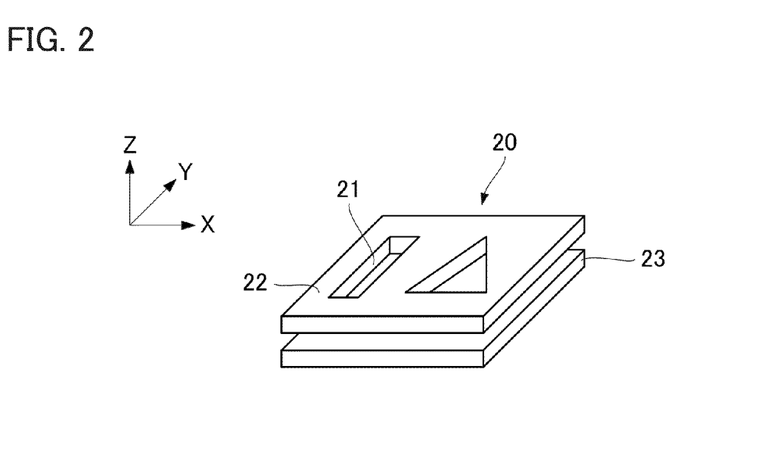
FIG. 2 is a diagram illustrating the configuration of a detector.

FIG. 2 is a schematic perspective view illustrating the configuration of the detection device 20. The detection device 20 includes a reference plate (shield member) 22 configured to include a detection mark (transmitting region) 21 for transmitting the irradiated electron beam and shield an electron beam outside the detection mark 21, and a sensor (detector) 23 configured to receive the transmitted electron beam and convert it into an electrical signal. The detection mark 21 is, for example, the two types of holes provided through the reference plate 22. The planar shapes of the holes are rectangular and triangular shapes as shown in FIG. 2. Note that the detection mark 21 is not necessarily a hole but may also be formed of, for example, a member permeable to an electron beam. Here, it is desirable that the surface height of the reference plate 22 be substantially the same as that of the substrate 7 to be treated upon placement of the substrate 7 to be treated on the substrate stage 5. Also, for installation of the reference plate 22, it is desirable that the XY coordinate system according to the arrangement of the detection mark 21 be adjusted so as to be the same as the XY coordinate system according to the direction of movement of the substrate stage 5. The sensor 23 converts the amount of electron beam reached the detection surface into an electrical signal. The sensor 23 is not limited to the one that converts the amount of electron beam directly into an electrical signal but may also be the one that once applies an electron beam to a fluorescer and then converts a signal of light reflected from the fluorescer into an electrical signal.

The controller 6 has various control circuits that control the operation of the components related to the drawing operation by the drawing apparatus 1, and a main controller 30 that supervises the control circuits. As the control circuits, the controller 6 includes a lens control circuit (not shown), a blanking deflector control circuit 31, a deflector control circuit 32, a detector control circuit 33, and a stage control circuit 34. Firstly, the lens control circuit controls the operation of the collimator lens 10 and electrostatic lens arrays 12, 16, and 17. The blanking deflector control circuit 31 controls the operation of the blanking deflector array 13 based on a blanking signal generated by a drawing pattern generation circuit, a bit map conversion circuit, and a blanking command generation circuit included in the controller 6. Here, the drawing pattern generation circuit generates a drawing pattern and the bit map conversion circuit converts the drawing pattern into bitmap data. The blanking command generation circuit generates a blanking signal based on bitmap data. The deflector control circuit 32 controls the operation of the deflector array 15 based on a deflection signal generated by the deflection signal generation circuit included in the controller 6.

The detector control circuit 33 determines the presence or absence of electron beam irradiation upon receipt of the output from the sensor 23 and transmits the determination result to the main controller 30. Furthermore, the detector control circuit 33 measures the characteristics of the irradiated electron beam in association with the stage control circuit 34 (to be described below) via the main controller 30. At this time, the measurement items are, for example, the shape, position, and intensity of an electron beam. During measuring the characteristics, the detector control circuit 33 transmits the result detected by the sensor 23 to the main controller 30, the stage control circuit 34 transmits position information about the stage at the moment to the main controller 30, and the deflector control circuit 32 also transmits the amount of deflection (deflection width) at the moment to the main controller 30. Then, the main controller 30 calculates the shape, position, and intensity of an electron beam based on these data.

The stage control circuit 34 calculates a target value to be instructed to the substrate stage 5 based on stage position information (position coordinates) which is a command from the main controller 30, and drives the substrate stage 5 such that the position thereof reaches the target value after being driven. At this time, data measured by the interferometer is processed by the main controller 30 via the stage control circuit 34 and then is returned to the stage control circuit 34 again to be used for controlling the position of the substrate stage 5. Here, the stage control circuit 34 continuously scans the substrate 7 to be treated (the substrate stage 5) in the Y-axis direction during pattern drawing. At this time, the deflector array 15 deflects an image formed on the surface of the substrate 7 to be treated in the X-axis direction with reference to the length measuring result of the substrate stage 5 measured by the interferometer. Then, the blanking deflector array 13 performs the blanking (OFF of irradiation) of electron beams so as to obtain the target dose on the substrate 7 to be treated.

In particular, in the present embodiment, a beam measuring apparatus is constituted by at least the detection device 20, the relative movement mechanism that causes a relative movement between the reference plate 22 and the electron beam so as to make either the edge of the detection mark 21 or the electron beam traverse the other, and the controller 6. Here, for the relative movement mechanism to be described below, the substrate stage 5 on which the detection device 20 is provided may be applied as a mechanism for moving the reference plate 22, that is, the detection device 20, and the deflector array 15 may be applied as a mechanism for moving (deflecting) an electron beam.

Here, an electron beam which has passed through the collimator lens 10 is typically divided into a plurality of electron beams by the aperture array 11. At this time, heat is generated due to the electron beam shielded by the aperture array 11. Consequently, the aperture array 11 may be thermally expanded, resulting in a change in the opening position of the aperture array 11. Also, the blanking deflector array 13 may be affected by heat generation due to electric current for controlling the deflection of an electron beam, resulting in a change in the opening position of the blanking deflector array 13. Furthermore, electron beam positional error may occur under the influence of a variation in the magnetic field from the outside of the optical system 4 or electrification/magnetization thereof and the shape of the edge of the detection mark may change due to contamination (deposits) accumulated in the detection device 20 by repeating a long-time measurement. These effects may cause an electron beam irradiating position to change gradually with time. In contrast, the half-width of an electron beam to be measured by the detection device 20 needs to be narrowed down so as to be substantially equivalent to the required drawing line width. For example, when drawing with a line width of 22 nm or less is performed, the electron beam diameter becomes 22 nm or less with a half-width of Gaussian distribution. As the required drawing line width becomes thinner, the measurement accuracy for the position, shape, and intensity of an electron beam becomes more demanding. For example, the position of an electron beam needs to be measured with the accuracy of 10% or less of a drawing line width. In the foregoing example, the measurement accuracy of 2 nm or less needs to be achieved.

Figure 3:
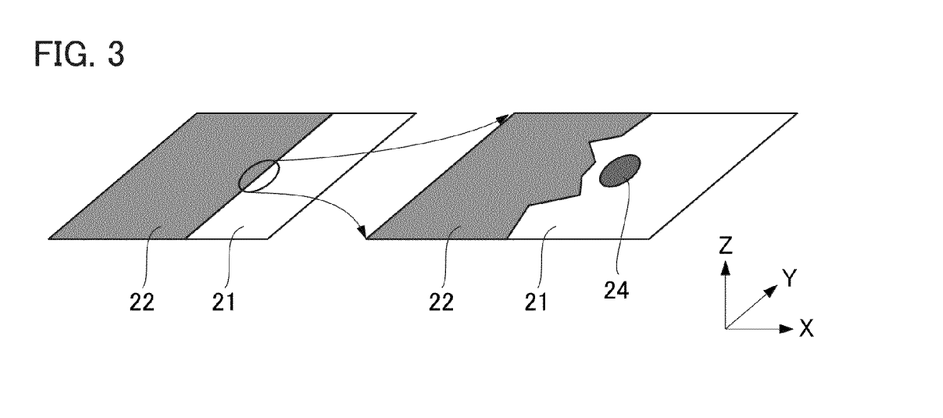
FIG. 3 is a diagram illustrating the shape of the edge of a detection mark.

FIG. 3 is a schematic perspective view illustrating a part of the border portion of the detection mark 21 formed on the reference plate 22 as an example. The right side of FIG. 3 is an enlarged part (circle in FIG. 3) of the border portion of the detection mark 21 shown at the left size of FIG. 3. As shown in FIG. 3, although the border portion looks straight at a glance, the roughness, which may adversely affect the detection by the detection device 20, is present at the border portion if the diameter of the electron beam 24 is on the order of 11 to 22 nm. In other words, if the electron beam diameter is 100 nm or greater, the required drawing accuracy is low, and thus, such roughness can be ignored by using the averaging effect of convolution calculation, whereas if the electron beam diameter is 22 nm or less, such roughness cannot be ignored. In particular, in the case of simple measurement reproducibility, i.e., when measurement is repeatedly performed at the same position of the border portion, the roughness of the border portion may have a small effect on the measurement accuracy. In contrast, when the change over time in the position of the electron beam 24 is measured, the measurement accuracy (measurement reproducibility accuracy) for the absolute position of the electron beam 24 may not be ensured due to the influence of the roughness. Consequently, a measurement error generated due to such an influence may adversely affect on drawing accuracy and overlay accuracy. Thus, the beam measuring apparatus of the present embodiment measures the shape, position, and intensity of the electron beam 24 while taking the border portion of the detection mark 21, i.e., the roughness (shape) of the edge into consideration.

Figure 4A:
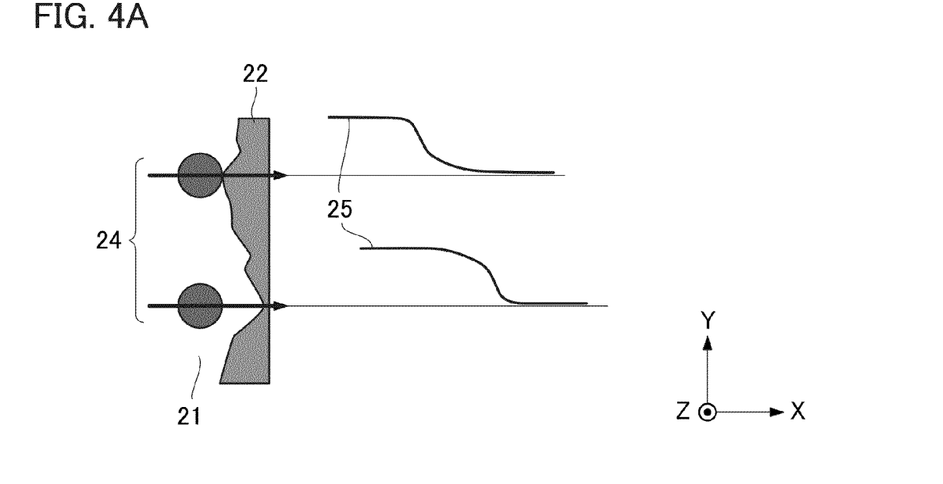
FIG. 4A is a diagram illustrating the measurement of the shape of the edge of a detection mark by the conventional drawing apparatus.
Figure 4B:
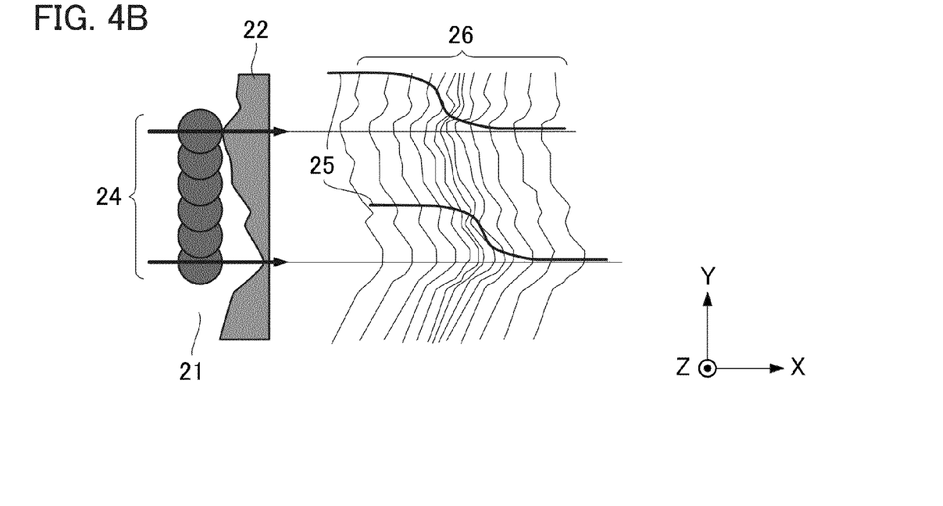
FIG. 4B is a diagram illustrating the measurement of the shape of the edge of a detection mark by the drawing apparatus of the present embodiment.

Next, a description will be given of the operation of the beam measuring apparatus while taking the roughness of the edge into consideration. Each of FIGS. 4A and 4B is a schematic view illustrating the positional relationship between the electron beam 24 and the edge as well as the output signal from the sensor 23 with respect to the positional relationship when the shape, position, or intensity of the electron beam 24 is measured using a knife-edge method. In particular, FIG. 4A shows the result obtained by the conventional drawing apparatus and FIG. 4B shows the result obtained by the drawing apparatus 1 (beam measuring apparatus) of the present embodiment. A first graph 25 in FIG. 4A shows the value of the output signal (vertical axis), with respect to the position of the substrate stage 5 (horizontal axis). Firstly, according to the conventional measurement method shown in FIG. 4A, the value of the output signal is substantially constant as shown in the first graph 25 if the electron beam 24 is in the detection mark 21. On the other hand, when the electron beam 24 passes through the edge, the value of the output signal gradually decreases. When the electron beam 24 completely rests on the reference plate 22, the value of the output signal becomes substantially zero. However, the output signals are slightly different from each other due to the roughness (unevenness) of the corresponding edge upon measurement and the position at which a value changes also varies even if the position of the electron beam 24 is the same.

In contrast, the beam measuring apparatus of the present embodiment employs the knife-edge method and deflects the electron beam 24 to be measured in a direction (second direction: deflection direction) intersecting the direction of travel of the edge, i.e., the direction along which the substrate stage 5 is driven (first direction: X-axis direction). The deflection may be performed using, for example, the deflector array 15 or may also be performed using another dedicated deflector. In this case, the controller 6 executes measurement by setting the deflection speed of the electron beam 24 at a sufficiently fast speed (e.g., 20 times) with respect to the moving speed of the edge, i.e., the driving speed of the substrate stage 5. A sensor output map (hereinafter referred to as "map") 26 is a map in which the measured output signals are displayed based on the position of the substrate stage 5 and the deflected position of the electron beam 24 at the moment. Each line of the map 26 indicates an isopleth (a line connecting equal values of output signal together). When the output signals are plotted at the position of the substrate stage 5 while fixing the deflected position of the map 26, the same graph as the first graph 25 shown in FIG. 4A is obtained.

Here, the controller 6 controls the substrate stage 5 (the detection device 20) and the relative movement mechanism so as to cause the edge to traverse the electron beam 24 with respect to a plurality of points on the edge to thereby obtain a plurality of signals using the sensor 23. Next, the controller 6 sums the signals corresponding to the relative position of the relative movement among the plurality of signals obtained to thereby obtain a signal sequence. More specifically, the controller 6 sums the values of the output signals obtained from a one-time deflection of the electron beam 24. The controller 6 executes summation for each deflection to thereby acquire data in which the influences of the roughness of the edge are eliminated (reduced) by averaging (data obtained by a convolution (calculation) between the ideal shape of the edge and the intensity distribution of the electron beam 24 or data which can be deemed as such). Then, the controller 6 performs deconvolution calculation based on the assumption that the shape of the edge has the ideal shape (reference shape) to thereby determine the intensity distribution of the electron beam 24. The controller 6 further determines predetermined characteristics of the electron beam 24 such as the shape, position, or intensity of the electron beam 24 using the intensity distribution. Note that the intensity distribution may be obtained not only by deconvolution calculation but also, for example, by differentiation of data obtained by averaging. Predetermined characteristics of the electron beam 24 such as the shape, position, or intensity of the electron beam 24 can be determined from data obtained by differentiation.

If the characteristics of the electron beam 24 thus obtained are varied for each electron beam, a distortion of a pattern to be drawn on a substrate and an energy (exposure dose) distribution in a drawing region may fall outside the allowable range. Thus, the main controller 30 controls at least one of deflection and blanking of the electron beam 24 based on the characteristic data of the measured electron beam 24 such that these characteristics fall within the allowable range. At this time, the main controller 30 controls via at least one of the deflector control circuit 32 and the blanking deflector control circuit 31.

Next, the controller 6 can determine the shape of the edge by executing deconvolution calculation of the map 26 using the measured shape of the electron beam 24. Also, the controller 6 stores edge shape data therein and compares the edge shape data for each measurement to thereby be able to confirm the change over time in the shape of the edge. Furthermore, the controller 6 is capable of executing the optimization of the deflection speed of the electron beam 24 and the driving speed of the substrate stage 5 based on edge shape data. In particular, in the multi-beam type drawing apparatus 1 as used in the present embodiment, the number of electron beams tends to be increased in order to meet the needs of making a drawing line width thinner and achieving higher throughput. For example, if the number of electron beams is at the level of a few thousands, an increase in the measurement time of the individual electron beam 24 to some extent may be acceptable, whereas if the number of electron beams is at the level of a few hundreds of thousands, a slight increase in the measurement time of the individual electron beam 24 affects overall throughput. Thus, the measurement time may be desired to be as short as possible while maintaining the balance between the measurement time and the measurement accuracy of the electron beam 24.

Figure 5:
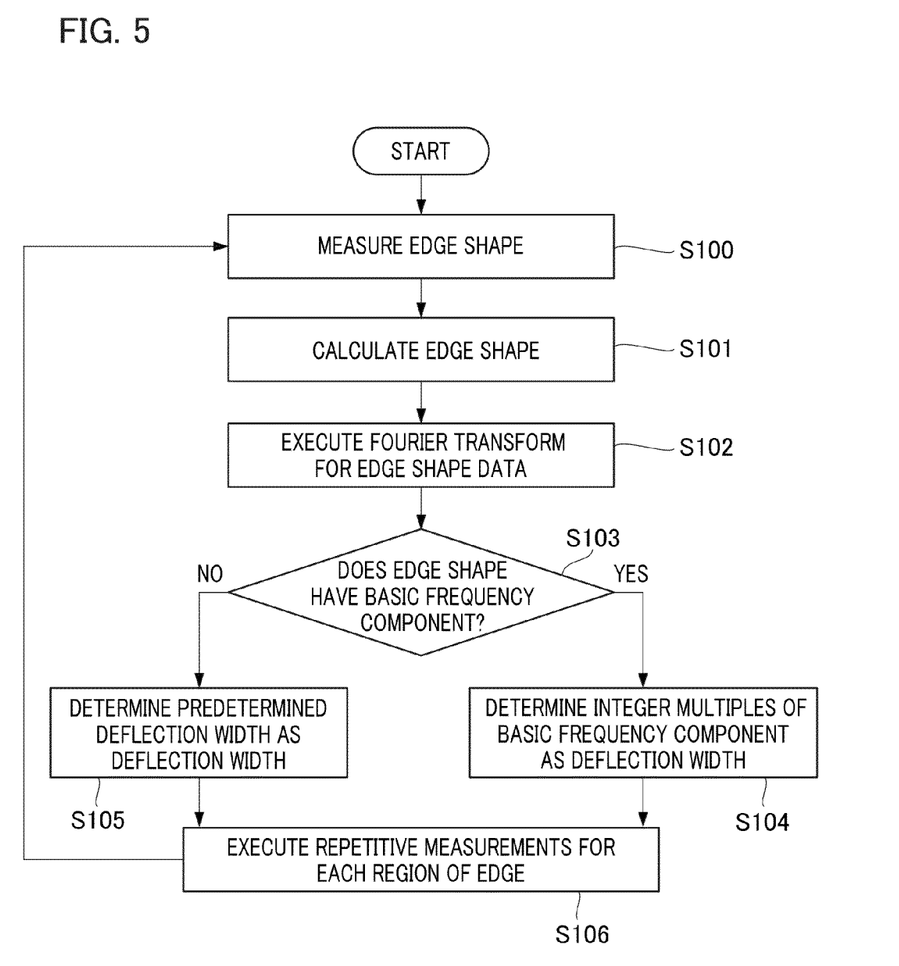
FIG. 5 is a flowchart illustrating the flow of how the deflection width of an electron beam is optimized.

Next, a description will be given of optimization of the deflection width of the electron beam 24. FIG. 5 is a flowchart illustrating the flow of how the deflection width of an electron beam is optimized based on the shape of the edge. Firstly, the controller 6 executes measurement of the shape of the edge (two-dimensional data) using the foregoing measuring method (step S100). Next, the controller 6 refers to the map 26 obtained in step S100 to thereby calculate the shape of the edge (step S101). Next, the controller 6 performs Fourier transform for the edge shape data obtained in step S101 (step S102), and then determines the presence or absence of the basic frequency component (step S103). Here, the reason for determining the presence or absence of the basic frequency component is that the deflection width of the electron beam 24 is preferably integral multiples of its period from the viewpoint of accuracy of measurement when the shape of the edge has a particular basic frequency component. On the other hand, when the shape of the edge has no basic frequency component, the shape of the edge is considered to be randomized. Hence, a width capable of sufficiently averaging the random component may be determined as the deflection width of the electron beam 24. Thus, if it has been determined in step S103 that the basic frequency component is present, the controller 6 determines the deflection width of the electron beam 24 to be integer multiples (e.g., two times) of a basic period (step S104). On the other hand, if it has been determined in step S103 that the basic frequency component is absent, the controller 6 determines the deflection width of the electron beam 24 to be a predetermined fixed width (step S105). In this manner, optimization of the deflection width of the electron beam 24 is completed. Since it is preferable that the optimization is executed not only for a part of the edge but also for the whole border portion of a detection mark, the controller 6 executes optimization repeatedly for each region of the edge (step S106).

Figure 6:
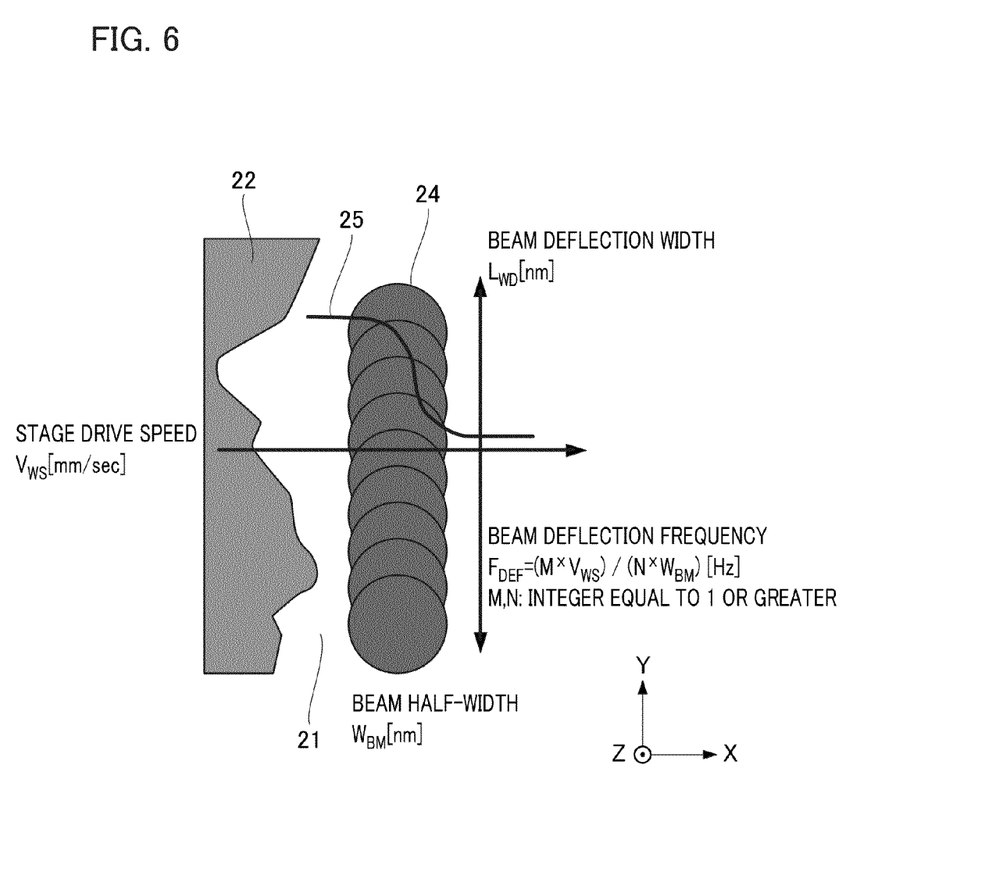
FIG. 6 is a diagram illustrating the optimization of the deflection frequency or the like of an electron beam.

Next, a description will be given of optimization of the deflection frequency of the electron beam 24 and the driving speed of the substrate stage 5 (the moving speed of the edge). FIG. 6 is a schematic view illustrating the optimization of the deflection frequency of the electron beam 24 and the driving speed of the substrate stage 5. Note that the electron beam 24 is deflected in a direction substantially perpendicular to the drive direction of the substrate stage 5. For example, the deflection width $L_{WD}$ (nm) of the electron beam 24 is optimized by the method as shown in FIG. 5. Here, if the half-width of the electron beam 24 is designated as $W_{BM}$ (nm), the detection pitch $M_{PCH}$ (nm) depends on the resolution with which the electron beam 24 is wished to be detected. Thus, if the detection pitch $M_{PCH}$ (nm) is 1/M (where M is an integer equal to 1 or greater) of the half-width of the electron beam 24, the detection pitch $M_{PCH}$ (nm) is represented by Formula (1).

$$M_{PCH} = W_{BM}/M \quad (1)$$

Next, the relationship between the driving speed $V_{WS}$ (mm/sec) of the substrate stage 5 and the deflection frequency $F_{DEF}$ (Hz) of the electron beam 24 are considered using Formula (1). Firstly, the movement time $T_{PCH}$ (sec) of the substrate stage 5 in a measurement pitch $M_{PCH}$ is represented by Formula (2).

$$T_{PCH} = M_{PCH}/V_{WS} \quad (2)$$
$$= W_{BM}/(M \times V_{WS})$$

Also, since a one-time deflection of the electron beam 24 needs to be ended within the movement time $T_{PCH}$, the deflection frequency $F_{DEF}$ is represented by Formula (3), where N is an integer equal to one or greater.

$$F_{DEF} = N/T_{PCH} \quad (3)$$
$$= N \times (M \times V_{WS})/(W_{BM})$$

Thus, the controller 6 can optimize either one of the deflection frequency of the electron beam 24 or the driving speed of the substrate stage 5 based on the other using Formula (3). Consequently, both measurement accuracy and measurement throughput can be optimized.

In this manner, when the controller 6 executes electron beam measurement by moving the edge, the controller 6 deflects the electron beam 24 in a direction perpendicular to the measurement direction by setting the deflection speed of the electron beam 24 at a sufficiently fast speed relative to the moving speed of the edge. Then, the controller 6 executes electron beam measurement and measurement of two-dimensional data of the edge at the same time, calculates the shape of the edge from two-dimensional data of the edge, and corrects the result of measurement of electron beam so as to suppress the influence of the shape of the edge, whereby highly accurate measurement data can be obtained. Therefore, the influence of the roughness of the edge can be reduced in order to ensure the measurement accuracy in determining the absolute position of the electron beam 24. Consequently, the shape, position, and intensity of the electron beam 24 can be surely measured with high accuracy.

As described above, according to the present embodiment, a beam measuring apparatus that is advantageous for accurately measuring an electron beam or the like and a drawing apparatus using the same may be provided. Also, the beam measuring apparatus can perform beam measurement in a measurement time equivalent to the measurement time required for the conventional knife-edge method. Thus, high performance/high precision can be achieved without prolonging the measurement time. Also, the measurement accuracy in determining the absolute position of the beam can be ensured, and thus, a drawing error due to a correction error in beam position can be reduced. Consequently, drawing can be seamlessly performed without producing an error, resulting in an improvement in the overlay accuracy for the base pattern on the substrate 7 to be treated. Hence, an article (device) with reduced variation in the electric operation can be manufactured, resulting in an improvement in yield. Furthermore, according to the present embodiment, for a correction error in beam position caused by a change in the shape of the edge due to the presence of contamination, the measurement accuracy in determining the absolute position of the beam can be ensured by correcting the affect on a change in the shape of the edge at all times. Thus, the influence of the change over time in the roughness of the edge can be suppressed.

(Article Manufacturing Method)

An article manufacturing method according to an embodiment of the present invention is preferred in, for example, manufacturing a micro device such as a semiconductor device or the like or an article such as an element or the like having a microstructure. The article manufacturing method may include the steps of forming, in a latent image pattern step (a step of drawing a pattern on a substrate), a latent image pattern on a substrate on which a photosensitizing agent is coated using the aforementioned drawing apparatus; and developing the substrate on which the latent image pattern has been formed in the latent image pattern step. Furthermore, the article manufacturing method may include other known steps (oxidizing, film forming, vapor depositing, doping, flattening, etching, resist peeling, dicing, bonding, packaging, and the like). The article manufacturing method of the present embodiment has an advantage, as compared with a conventional article manufacturing method, in at least one of performance, quality, productivity and production cost of an article.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2011-154766 filed on Jul. 13, 2011 which are hereby incorporated by reference herein in its entirety.

What is claimed is:

1. A measuring apparatus for measuring a characteristic of a beam, the apparatus comprising:
   a detection device including a shield member that has an edge, and a detector configured to detect the beam of which at least a part is not shielded by the shield member;
   a relative movement mechanism configured to cause a relative movement between the shield member and the beam; and
   a controller configured to control the detection device and the relative movement mechanism so as to cause one of the edge and the beam to traverse the other with respect to each of a plurality of points on the edge, to sum a plurality of signals, respectively obtained by the detection device with respect to the plurality of points and with respect to relative positions of the relative movement corresponding to one another, so as to obtain a signal sequence, and to obtain the characteristic based on the signal sequence.

2. The measuring apparatus according to claim 1, wherein the relative movement mechanism is configured to cause the detection device to move in a first direction in which the one traverses the other, and to cause the beam to deflect in a second direction other than the first direction.

3. The measuring apparatus according to claim 2, wherein the controller is configured to obtain a shape of the edge based on the plurality of signals, to obtain a basic frequency component of the shape of the edge, and to set a width of deflection of the beam in the second direction based on information about the basic frequency component.

4. The measuring apparatus according to claim 2, wherein the controller is configured to set one of a moving speed of the detection device in the first direction and a deflection frequency of the beam in the second direction based on the other.

5. The measuring apparatus according to claim 1, wherein the controller is configured to obtain an intensity distribution of the beam as the characteristics based on the signal sequence, and to obtain a shape of the edge by deconvolution of the plurality of signals with data of the intensity distribution.

6. The measuring apparatus according to claim 1, wherein the controller is configured to obtain an intensity distribution of the beam by deconvolution of the signal sequence with data of a reference shape of the edge.

7. The measuring apparatus according to claim 1, wherein the controller is configured to obtain an intensity distribution of the beam by differentiation of the signal sequence.

8. A drawing apparatus that performs drawing on a substrate with a beam, the apparatus comprising:
 a beam measuring apparatus for measuring a characteristic of the beam, the measuring apparatus comprises:
  a detection device including a shield member that has an edge, and a detector configured to detect the beam of which at least a part is not shielded by the shield member;
  a relative movement mechanism configured to cause a relative movement between the shield member and the beam; and
  a controller configured to control the detection device and the relative movement mechanism so as to cause one of the edge and the beam to traverse the other with respect to each of a plurality of points on the edge, to sum a plurality of signals, respectively obtained by the detection device with respect to the plurality of points and with respect to relative positions of the relative movement corresponding to one another, so as to obtain a signal sequence, and to obtain the characteristic based on the signal sequence.
 shield membershield membershield member 9. The drawing apparatus according to claim 8, further comprising:
 a stage configured to hold the substrate and to be moved, wherein the detection device is included in the stage.

10. A method of manufacturing an article, the method comprising:
 performing drawing on a substrate with a beam using a drawing apparatus that includes a measuring apparatus for measuring a characteristic of a beam;
 developing the substrate on which the drawing has been performed; and
 processing the developed substrate to manufacture the article,
 wherein the measuring apparatus includes:
  a detection device including a shield member that has an edge, and a detector configured to detect the beam of which at least a part is not shielded by the shield member;
  a relative movement mechanism configured to cause a relative movement between the shield member and the beam; and
  a controller configured to control the detection device and the relative movement mechanism so as to cause one of the edge and the beam to traverse the other with respect to each of a plurality of points on the edge, to sum a plurality of signals, respectively obtained by the detection device with respect to the plurality of points and with respect to relative positions of the relative movement corresponding to one another, so as to obtain a signal sequence, and to obtain the characteristic based on the signal sequence.

* * * * *